(12) United States Patent
De Young et al.

(10) Patent No.: US 10,892,167 B2
(45) Date of Patent: Jan. 12, 2021

(54) GAS PERMEABLE SUPERSTRATE AND METHODS OF USING THE SAME

(71) Applicant: CANON KABUSHIKI KAISHA, Tokyo (JP)

(72) Inventors: James P. De Young, Dallas, TX (US); Weijun Liu, Cedar Park, TX (US); Fen Wan, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 51 days.

(21) Appl. No.: 16/293,053

(22) Filed: Mar. 5, 2019

(65) Prior Publication Data
US 2020/0286740 A1    Sep. 10, 2020

(51) Int. Cl.
*H01L 21/3105* (2006.01)
*H01L 21/02* (2006.01)

(52) U.S. Cl.
CPC .. *H01L 21/31051* (2013.01); *H01L 21/02118* (2013.01)

(58) Field of Classification Search
None
See application file for complete search history.

(56) References Cited

U.S. PATENT DOCUMENTS

| | | | |
|---|---|---|---|
| 6,048,799 A | 4/2000 | Prybyla | |
| 7,790,231 B2 | 9/2010 | McCutcheon et al. | |
| 9,718,096 B2 | 8/2017 | Sreenivasan et al. | |
| 2004/0115823 A1* | 6/2004 | Potyrailo | G01N 29/222 436/124 |
| 2010/0056752 A1 | 3/2010 | Okamoto et al. | |

OTHER PUBLICATIONS

Yavari et al., Dioxolane-Based Perfluoropolymers with Superior Membrane Gas Separation Properties, Mar. 19, 2018, pp. 2489-2497. (Year: 2018).*
Yu et al. High transport parameters and free voluem of perfluorodioxole (1997), pp. 123-132. (Year: 1997).*
Alentiev et al.,"High transport parameters and free volume of perfluorodioxole copolymers," Journal of Membrane Science, vol. 2, Issue 1, dated Apr. 2, 1997, pp. 123-132 (abstract only).
Nakai et al., "Enhancement of Gas Permeability in HPC, CTA and PMMA under Microwave Irradiation," Polymer Journal, vol. 38, No. 4, dated 2006, pp. 376-380.

(Continued)

*Primary Examiner* — Angel Roman
(74) *Attorney, Agent, or Firm* — Abel Schillinger, LLP

(57) ABSTRACT

A gas permeable superstrate and method using the same is disclosed. The superstrate can include a body and an amorphous fluoropolymer layer on the body. The method of planarization can include dispensing a planarization precursor material over a substrate and contacting the planarization precursor material with a body of a superstrate. In one embodiment, the substrate includes a non-uniform surface topography. The method can also include curing the planarization precursor material to form a planarization layer over the substrate, where curing can be performed while the superstrate is contacting the planarization precursor material.

20 Claims, 5 Drawing Sheets

(56) References Cited

OTHER PUBLICATIONS

Pinnau et al., "Gas and vapor transport properties of amorphous perfluorinated copolymer membranes based on 2,2-pistrifluoromethyl-4,5-difluoro-1,3-dioxole / tetrafluoroethylene," Journal of Membrane Science, 109, dated 1996, pp. 125-133.
Permeation Through Fluoropolymers, Corrosion Resistant Products Ltd, Littleborough, United Kingdom, retrieved Mar. 25, 2020 (http://www.crp.co.uk/technical.aspx?page=199), 5 pages.
International Search Report and Written Opinion for PCT/US20/16315, dated Jul. 31, 2020, 14 pages.
Corrosion Resistant Products Ltd "Permeation Through Fluoropolymers", Mar. 10, 2008, retrieved from the Internet: http://www.crp.co.ukltechnical.aspx?page=199, 5 pages.
Welding Journal "Table 2—Permeability Coefficient of Common Polymers (Plastics)", Jun. 7, 2018, Retrieved from the Internet: http://www.faybutler.com/pdf_files/HowHoseMaterialsAffectGas3.pdf, 2 pages.
DuPont "DuPont Teflon AF Amorphous Fluoroplastic Resin", Jul. 30, 2013, retrieved from the Internet: http://www.yilectronics.com/contents/teflonadhesion.pdf, 3 pages.

\* cited by examiner

GAS PERMEABLE SUPERSTRATE AND METHODS OF USING THE SAME

FIELD OF THE DISCLOSURE

The present disclosure relates to substrate processing, and more particularly to planarization of surfaces in semiconductor fabrication.

RELATED ART

Planarization techniques are useful in fabricating electronic devices on semiconductor wafers. Such techniques can include the use of fluid dispense systems for depositing a formable material onto the wafer. A superstrate planarizes and/or patterns the dispensed material before the dispensed material is solidified on the wafer.

However, defects can arise as the superstrate separates from the dispense material on the substrate. Improvements in planarization techniques are desired to allow for whole wafer processing.

SUMMARY

In an aspect a superstrate can include a body with a contact surface and an amorphous fluoropolymer layer on the contact surface of the body. The amorphous fluoropolymer layer can be permeable to gases having an atomic mass greater than 4.

In another aspect, the amorphous fluoropolymer can include a dioxolane ring.

In yet another aspect, the amorphous fluoropolymer can include a perflurorodioxole tetrafluoroethylene copolymer.

In another aspect, the amorphous fluoropolymer can include a copolymer of perfluoro(3-butenyl vinyl ether).

In a further aspect, the body can include a hydrocarbon polymer layer between the contact surface and the amorphous fluoropolymer layer.

In another aspect, the hydrocarbon polymer layer can include polytrimethylsilyl propyne, polymethyl methacrylate, polycarbonate polymers, polyimides, and any combination thereof.

In another aspect, the amorphous fluoropolymer layer can have a critical surface tension of at least 20 mN/m and no more than 40 mN/m.

In yet another aspect, the amorphous fluoropolymer layer can include —(CXY—CF2-) a-(-Z-)b-, where X and Y can include F, Cl, or H, and Z can include a four (4), five (5), or six (6) member fluorocarbon ring structure containing at least one C—O—C linkage.

In another aspect, the amorphous fluoropolymer layer is permeable to nitrogen, oxygen, and argon.

In a further aspect, the amorphous fluoropolymer layer comprises an oxygen permeation coefficient of greater than $1.0 \times 10^{-10}$ cm3*cm/cm2*S*cmHg.

In another aspect, a method of planarization is disclosed. The method can include dispensing a planarization precursor material over a substrate, wherein the substrate includes a non-uniform surface topography and contacting the planarization precursor material with a superstrate. The superstrate can further include a body with a contact surface and an amorphous fluoropolymer layer on the contact surface of the body. The amorphous fluoropolymer layer can be permeable to gases having an atomic mass greater than 4. The method can also include curing the planarization precursor material to form a planarization layer over the substrate, wherein curing can be performed while the superstrate is contacting the planarization precursor material.

In another aspect, the method can include flowing an inert gas before contacting the planarization precursor material with the body of the superstrate.

In yet another aspect, the inert gas comprises oxygen, nitrogen, argon, or any combination thereof.

In a further aspect, the inert gas does not comprise helium.

In another aspect, the amorphous fluoropolymer comprises a dioxolane ring.

In a further aspect, the amorphous fluoropolymer comprises a perflurorodioxole tetrafluoroethylene copolymer.

In yet another aspect, the amorphous fluoropolymer is a polymer or copolymer of perfluoro(3-butenyl vinyl ether).

In another aspect, the amorphous fluoropolymer layer is permeable to nitrogen, oxygen, and argon, or any combination thereof.

In yet another aspect, a method of manufacturing is disclosed. The method of manufacturing can include dispensing a formable material on a substrate and contacting the formable material on the substrate with a superstrate to form a planar layer. The superstrate can further include a body with a contact surface and an amorphous fluoropolymer layer on the contact surface of the body. The amorphous fluoropolymer layer can be permeable to gases having an atomic mass greater than 4. The method can also include curing the planarization precursor material to form a planarization layer over the substrate, wherein curing is performed while the superstrate is contacting the planarization precursor material. The method of manufacturing can also include separating the superstrate and the planar layer on the substrate, processing the substrate on which the planar layer has been formed, and manufacturing the article from the processed substrate.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts.

Figure 1:
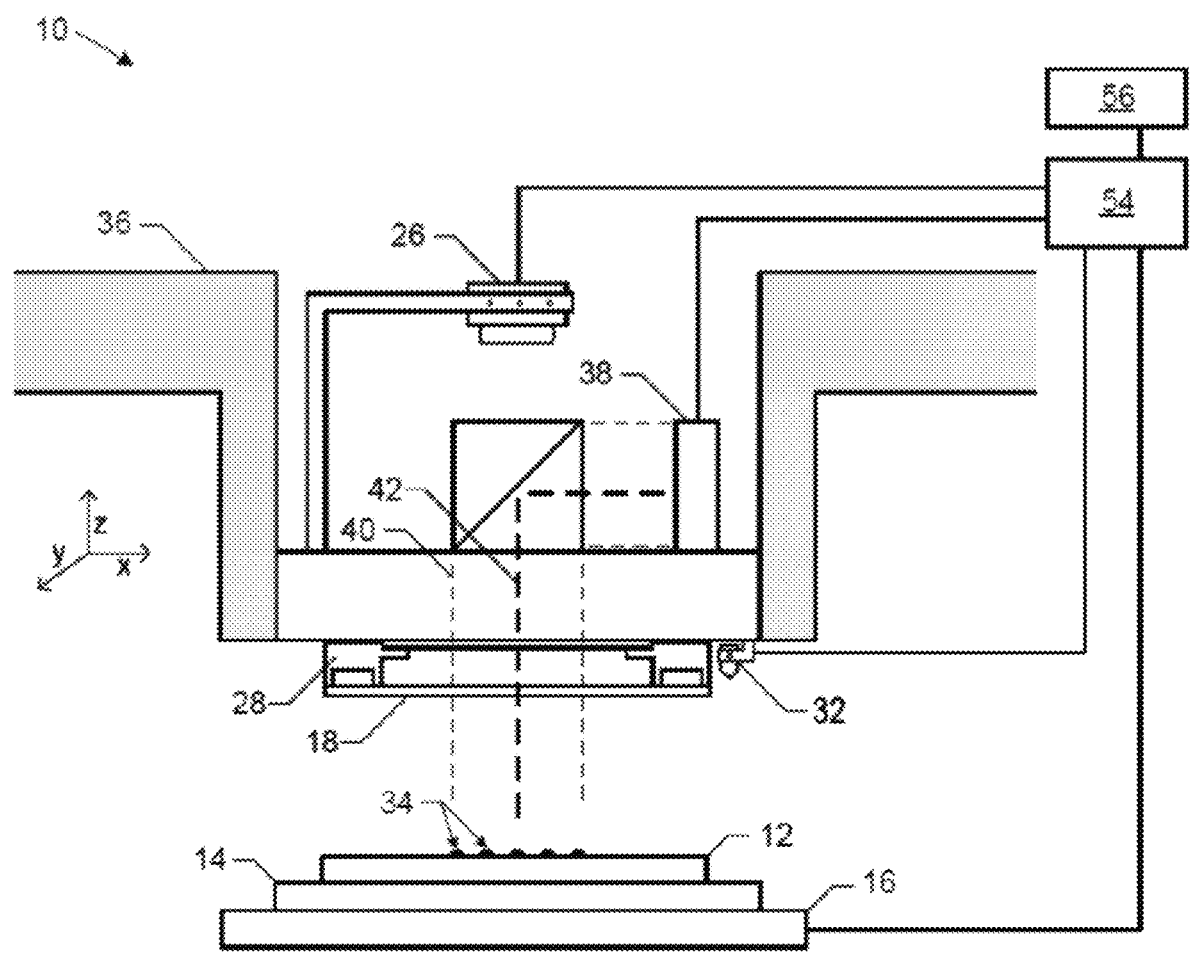
FIG. 1 includes an illustration of a side view of an exemplary system.

Referring to FIG. 1, an apparatus 10 in accordance with an embodiment described herein can be used to planarize a substrate 12. The substrate 12 may be a semiconductor base material, such as a silicon wafer, but may include an insulating base material, such as glass, sapphire, spinel, or the like. The substrate 12 may be coupled to a substrate holder 14. The substrate holder 14 may be a vacuum chuck; however, in other embodiments the substrate holder 14 may be any chuck including vacuum, pin-type, groove-type, electrostatic, electromagnetic, or the like. The substrate 12 and substrate holder 14 may be further supported by a stage 16. The stage 16 may provide translating or rotational motion along the X-, Y-, or Z-directions. The stage 16, substrate 12, and substrate holder 14 may also be positioned on a base (not illustrated).

Spaced-apart from the substrate 12 may be a superstrate 18. The superstrate 18 can include a body having a first side and a second side facing towards the substrate 12. In an embodiment, a mesa may extend from the second side (not shown). In another embodiment, the superstrate 18 can be formed without a mesa, as seen in FIG. 1. The superstrate 18 may be formed from such materials including a glass-based material, silicon, a spinel, fused-silica, quartz, silicon, organic polymers, siloxane polymers, fluorocarbon polymers, metal, hardened sapphire, other similar materials, or any combination thereof. The glass-based material can include soda lime glass, borosilicate glass, alkali-barium silicate glass, aluminosilicate glass, quartz, synthetic fused-silica, or the like. The superstrate 18 can include a deposited oxide, anodized alumina, an organo-silane, an organosilicate material, an organic polymer, inorganic polymers, and any combination thereof. As described in more details below, the superstrate 18 can include a layer 210. The body of the superstrate 18 can have a thickness in a range of 30 microns to 2000 microns.

The superstrate 18 can include a single or multi-piece construction. In one embodiment, a surface of the superstrate or mesa thereof can include a planar contact surface. In another embodiment, the contact surface can include features that define any original pattern that forms the basis of a pattern to be formed on the substrate 12.

Among other things, the superstrate 18 can be used to planarize a formable material deposited on a substrate 12. The superstrate 18 can be coupled to a superstrate holder 28. The superstrate 18 may be both held by and its shape modulated by the superstrate holder 28. The superstrate holder 28 may be configured to hold a superstrate 18 within a chucking region. The superstrate holder 28 can be configured as vacuum, pin-type, groove-type, electrostatic, electromagnetic, or another similar holder type. In one embodiment, the superstrate holder 28 can be used to modulate the shape of superstrate 18 by applying pressure, either positive or vacuum, to various zones of holder 28 in order to modulate the shape of the superstrate 18. In one embodiment, the superstrate holder 28 can include a transparent window within the body of the superstrate holder 28. In an embodiment, the superstrate holder 28 may be coupled to a head 26 such that the superstrate holder 28 or head 26 can facilitate translation or rotational motion of the superstrate 18 along the X-, Y-, or Z-directions. In one embodiment, the superstrate 18 can have a surface area that is about the same as the substrate 12. In one embodiment, the substrate 12 and superstrate 18 may have a 300 mm diameter. In one embodiment, the substrate 12 and superstrate 18 may have a diameter between 300 mm and 600 mm. In one embodiment, the substrate 12 and superstrate 18 may have a diameter between 300 mm and 450 mm. In another embodiment, the substrate 12 and superstrate 18 may have a diameter between 450 mm and 600 mm.

The apparatus 10 can further include a fluid dispense system 32 used to deposit a formable material 34 on the surface of the substrate 12. For example, the formable material 34 can include a polymerizable material, such as a resist or resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the superstrate 18 and the substrate 12. The formable material 34 can include a monomer or oligomer mixture that can be cured using ultraviolet light, heat, or the like.

The system 10 can further include an energy source 38 coupled to a direct energy 40 along a path 42. The head 26 and stage 16 can be configured to position the superstrate 18 and substrate 12 in superimposition with the path 42. The system 10 can be regulated by a logic element 54 in communication with the stage 16, head 26, fluid dispense system 32, or energy source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Figure 2:
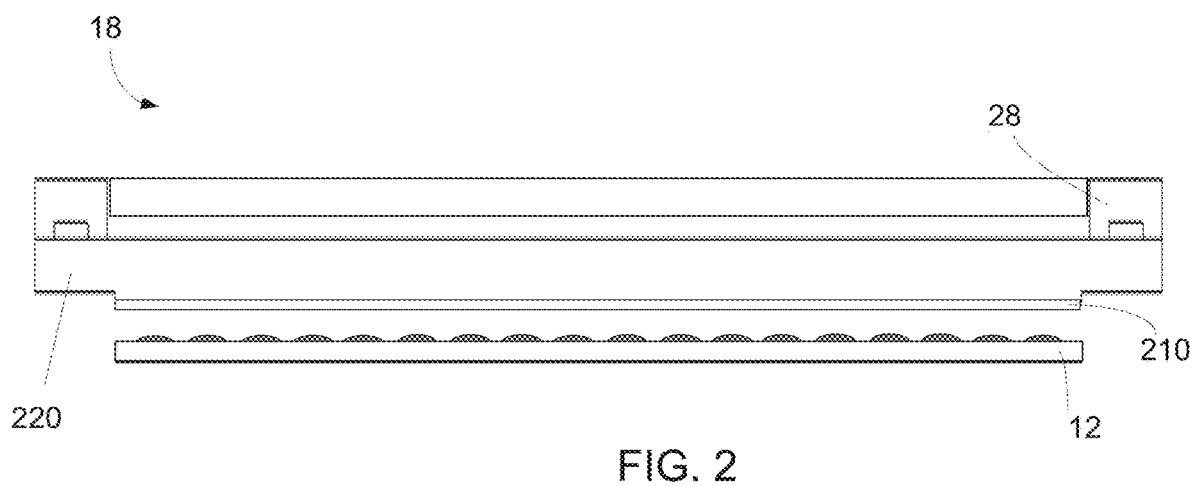
FIG. 2 includes an illustration of a side view of a superstrate, according to one embodiment.
Figure 3A:
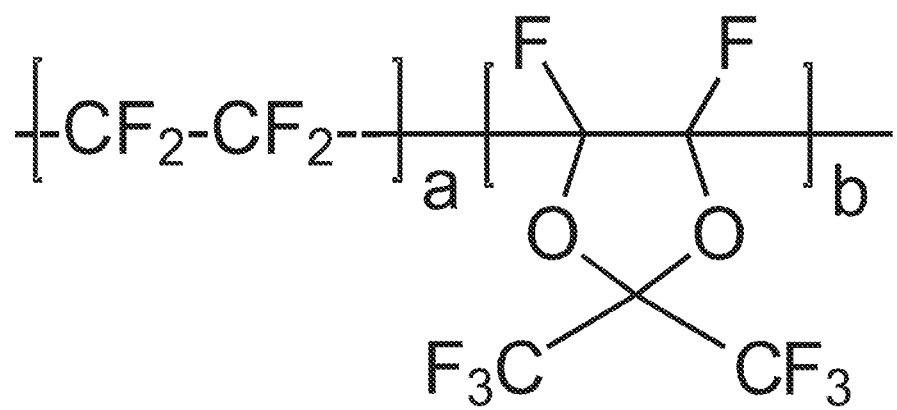
FIG. 3A includes an illustration of a general structure used in a superstrate of the system of FIG. 1, according to one embodiment.
Figure 3B:
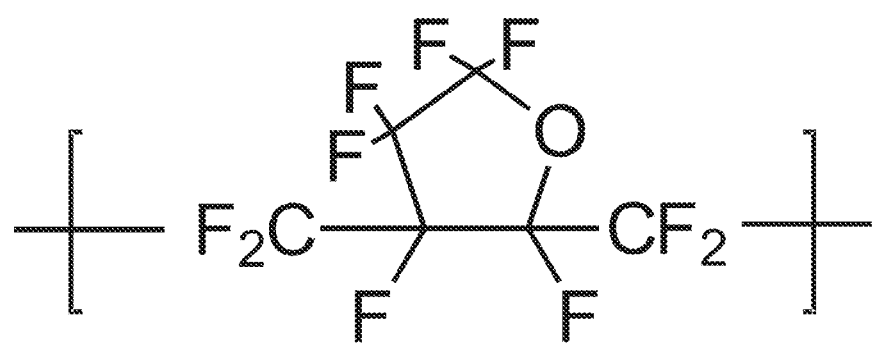
FIG. 3B includes an illustration of a general structure used in a superstrate of the system of FIG. 1, according to one embodiment.

FIG. 2 includes an illustration of a side view of a superstrate 18, according to one embodiment. The superstrate 18 can include a body 220 and a layer 210. The body 220 of the superstrate 18 may be formed from such materials including a glass-based material, silicon, a spinel, fused-silica, quartz, silicon, organic polymers, siloxane polymers, fluorocarbon polymers, metal, hardened sapphire, other similar materials, or any combination thereof. The glass-based material can include soda lime glass, borosilicate glass, alkali-barium silicate glass, aluminosilicate glass, quartz, synthetic fused-silica, or the like. The layer 210 can be an amorphous fluoropolymer layer. In one embodiment, the layer 210 can include a perflurorodioxole tetrafluoroethylene copolymer. In one embodiment, the layer 210 can include a dioxolane ring. In one embodiment, the layer 210 can include a chemical structure that includes —(CXY—CF$_2$—)$_a$-(-Z-)$_b$—, where X and Y can be F, Cl, or H and Z can be a four (4), five (5), or six (6) member fluorocarbon ring structure containing at least one C—O—C linkage. In another embodiment, the layer 210 can include a copolymer of 2, 2 bistriflurorormethyl-4,5-difluoro-1,3-dioxole (PDD), such as seen in FIG. 3A. In one embodiment, the layer 210 can include a chemical structure that includes —(CF$_2$—Z—CF$_2$—)-, where X and Y can be F, Cl, or H and Z can be a four (4), five (5), or six (6) member fluorocarbon ring structure containing at least one C—O—C linkage, as seen in FIG. 3B. In one embodiment, the layer 210 can include a monomer of formula 1 seen below.

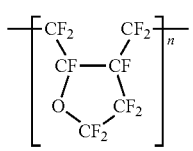

Formula 1

In one embodiment, the layer 210 can include a polymer made using perfluoro (3-butenyl vinyl ether) $CF_2=CF—O—CF_2CF_2CF=CF_2$. In one embodiment, the layer 210 can have a thickness greater than 100 nm, such as greater than 300 nm, or greater than 500 nm, or greater than 1 micron, or greater than 2 microns. In another embodiment, the layer 210 can have a thickness less than 5 microns, such as less than 4 microns, or less than as 3 microns. In another embodiment, the layer 210 can have a thickness that is between 100 nm and 5 microns. In another embodiment, the layer 210 can be permeable to gas, such as permeable to nitrogen, oxygen, helium, and argon. In another embodiment, the layer 210 can include an oxygen permeation coefficient of greater than $1.0\times10^{-10}$ $cm^3*cm/cm^2*S*cmHg$. In one embodiment, the layer 210 is on the body 220 of the superstrate 18. In another embodiment, the superstrate may include multiple layers between the body 220 and the layer 210. For example, in one embodiment, the superstrate can include the body 220, the layer 210, and a hydrocarbon polymer layer in between the body 220 and the layer 210. In one embodiment, the hydrocarbon polymer layer can include polytrimethylsilyl propyne (PTMSP), polymethyl methacrylate (PMMA), polycarbonate polymers, polyimides, or any combination thereof.

Among other things, the superstrate 18 can be used to planarize a formable material on a substrate 12. Over time, continued use can wear the surface of the superstrate 18. Conventionally, the superstrate 18 is replaced after damage occurs. However, the inventors have found a coating layer that can both protect the surface of a substrate 18 while enhancing the various requirements necessary to enable planarization, in particular planarization techniques where the resist material is dispensed as droplets onto the substrate, for example, inkjet-adaptive planarization (IAP process). As IAP processes may in particular use gases to reduce defects transferred to the substrate during planarization, any layer used needs to be permeable to the gas being used. Many processes use gases that are in high demand, low supply and thus expensive. As such, there exists a great need for a material that can meet all the requirements necessary to enable IAP. The layer 210 has good mechanical strength, a non-condensable gas transport property, high transport selectivity between non-condensable gases and condensable organic gases, UV transparency, and low adhesive forces between resist materials, such as e.g., acrylic, vinyl, and epoxy-based polymers to aid in the planarization process. To improve the wettability of the layer 210 with the formable materials during contact, the layer 210 can be chemically treated, with for example plasma treatments, to increase the surface energy of the layer 210. Treating the layer 210 can change the chemical nature of the polymer on the surface making contact with the formable material without substantially affecting the transport or selectivity of the polymer. In one embodiment, the layer 210 has a critical surface tension of at least 20 mN/m and no greater than 45 mN/m.

Gas transport selectivity between so called non-condensable gases such as oxygen and nitrogen and condensable organic gases such as methane, ethane, and propane can be described as the ratio of gas permeation coefficients through a film at common conditions. Due to the highly fluorinated nature of polymers most useful for layer 210, chemical sorption of organic gases is low, whereas sorption of organic vapors to predominantly hydrocarbon polymers can be high. For fluorocarbon polymers, this leads to improved selectivity between non-condensable gases and condensable organic gases. Polymers most useful for layer 210 will have nitrogen/propane selectivity greater than 3.0. This selectivity along with the very low solubility of formable materials (monomers) in the polymer films provide robust layers that can be used in IAP many times without film degradation. Film degradation can be a serious problem impacting the durability of gas permeation and/or protection layer when hydrocarbon polymers are used. This is largely due to the inherent solubility of typical hydrocarbon formable materials in hydrocarbon polymers like PMMA, PTMSP, polyimides, etc. The fluorocarbon polymers of the current embodiments, used as permeation protective layers exclusively or on top of hydrocarbon polymers, are not soluble in hydrocarbon-based formable materials. Therefore, these fluorocarbon polymer films are considerably more robust and durable when used as gas permeation-protective layers in IAP. The layer 210 can be permeable to molecules having an atomic mass greater than 1, such as an atomic mass greater than 4, or an atomic mass greater than 5, or an atomic mass greater than 12, or an atomic mass greater than 39.

Figure 4:
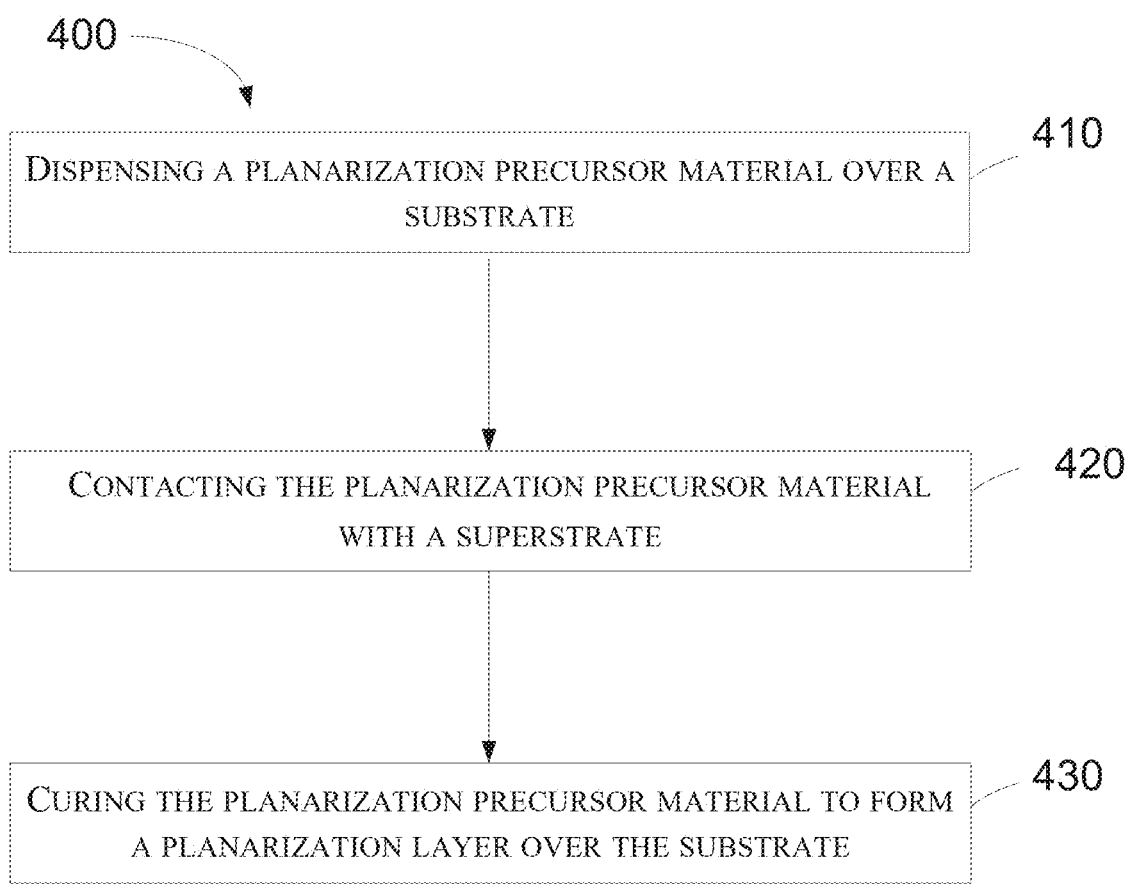
FIG. 4 includes an illustration of a method of the present disclosure.

FIG. 4 includes an illustration of a method 400 of the present disclosure. The method begins at operation 410 by dispensing a planarization precursor material 34 over a substrate 12. The substrate 12 can include a non-uniform surface topography. In other words, a surface of the substrate 12 may be non-uniform. The formable material 34 can include a polymerizable material, such as a resist. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the superstrate 18 and the substrate 12. The desired volume could include a gas. The method can include, for example, flowing a gas after the planarization precursors material is dispensed but prior to contact with the superstrate 18. The gas can include oxygen, nitrogen, argon, helium, or any combination thereof. In one embodiment, the gas flowed does not include helium. In one embodiment, the atomic mass of the molecules flowed is greater than 1, such as an atomic mass greater than 4, or an atomic mass greater than 5, or an atomic mass greater than 12, or an atomic mass greater than 39.

The superstrate 18 can contact the planarization precursor material 34, at operation 420. As the superstrate 18 contacts the planarization precursor material 34, any trapped gas particles can dissipate through the layer 220. In one embodiment, the superstrate 18 can have a body and an amorphous fluoropolymer layer, as described above.

The method can continue at operation 430 by curing the planarization precursor material 34 to form a planarization layer over the substrate 12. The formable material 34 can include a monomer or oligomer mixture that can be cured using ultraviolet light, heat, or the like. In one embodiment, curing is performed while the superstrate 18 is contacting the planarization precursor material 34. Following the curing, the superstrate 18 can be separated from the newly formed layer formed on the substrate 12. The layer 210 can protect the body 220 of the superstrate 18 such that the superstrate 18 can be used in subsequent planarization operations.

In one embodiment a method of manufacturing an article can include depositing a formable material 34 on a substrate 12 and contacting a superstrate 18 with the formable material 34 on the substrate 12. In one embodiment, the superstrate can include a body and a layer. The layer can include an amorphous fluoropolymer. The method of manufacturing an article can further include curing the formable material 34 to form a planar layer, separating the superstrate 18 and the formable material 34 on the substrate 12, processing the substrate 12 on which the planar layer has been formed, and manufacturing the article from the processed substrate 12.

Figure 5:
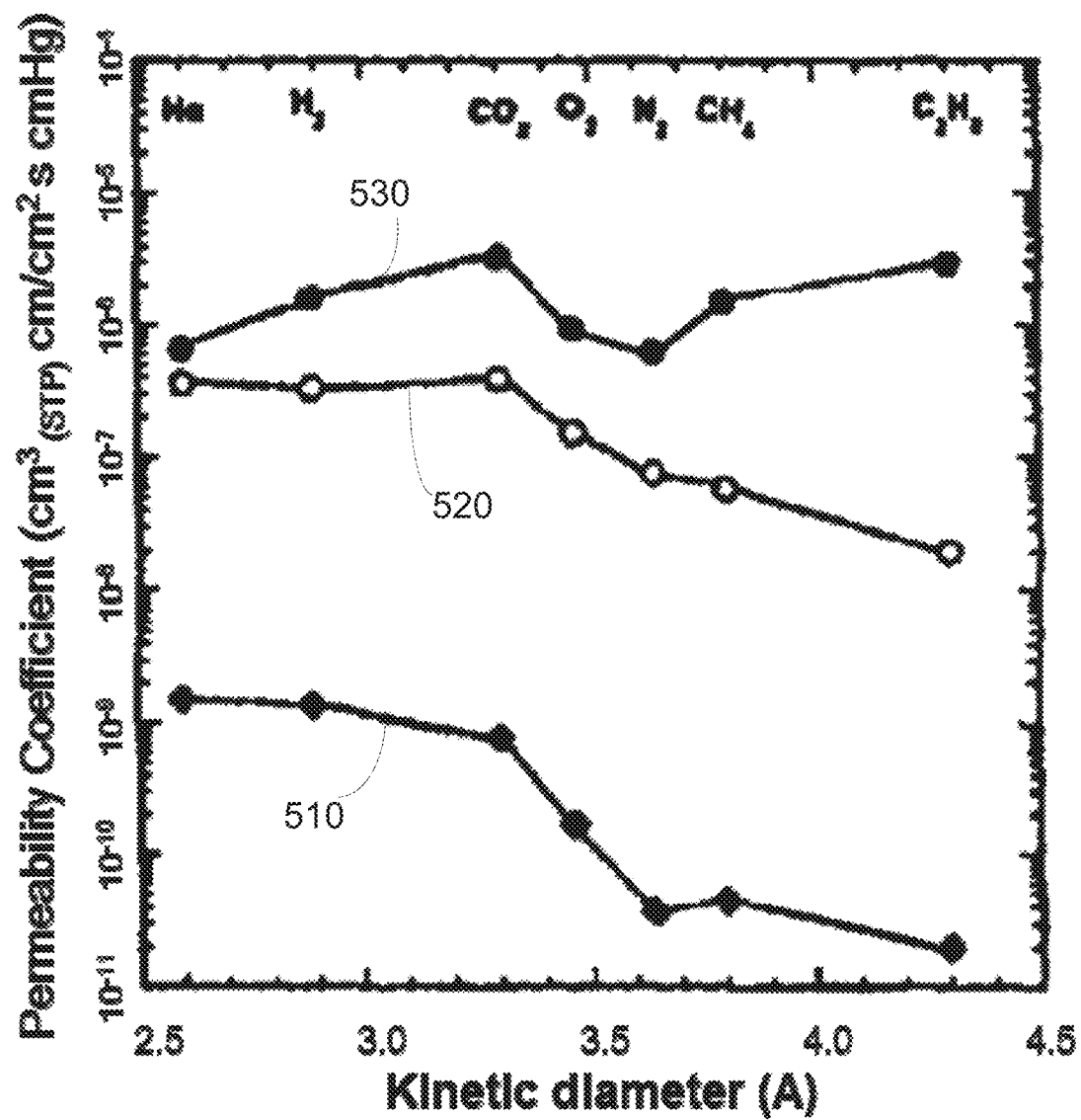
FIG. 5 includes an illustration of the permeability coefficients as a function of kinetic diameter for various compositions.

FIG. 5 includes an illustration of the permeability coefficients as a function of kinetic diameter for various compositions. As can be seen in FIG. 5, 510 can be the permeability coefficients of a layer including polycarbonate, 520 can be the permeability coefficients of a layer including an amorphous fluoropolymer, such as layer 210, and 530 can be the permeability coefficients of a layer including polytrimethylsilylpropyne. The layer 210 can have an oxygen permeation coefficient of greater than $1.0 \times 10^{-10}$ $cm^3*cm/cm^2*S*cmHg$, such as greater than $3.4 \times 10^{-10}$ $cm^3*cm/cm^2*S*cmHg$, such as greater than $3.4 \times 10^{-8}$ $cm^3*cm/cm^2*S*cmHg$, such as greater than $3.4 \times 10^{-7}$ $cm^3*cm/cm^2*S*cmHg$, or such as greater than $3.4 \times 10^{-6}$ $cm^3*cm/cm^2*S*cmHg$. The layer 210 can have a helium permeability coefficient of greater than $2.5 \times 10^{-8}$ $cm^3*cm/cm^2*S*cmHg$, such as $2.5 \times 10^{-7}$ $cm^3*cm/cm^2*S*cmHg$, or $2.5 \times 10^{-6}$ $cm^3*cm/cm^2*S*cmHg$. The layer 210 can have a hydrogen permeation coefficient of greater than $2.9 \times 10^{-8}$ $cm^3*cm/cm^2*S*cmHg$ such as $2.9 \times 10^{-7}$ $cm^3*cm/cm^2*S*cmHg$, or $2.9 \times 10^{-6}$ $cm^3*cm/cm^2*S*cmHg$.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A superstrate, comprising:
    a body, wherein the body comprises a contact surface; and
    an amorphous fluoropolymer layer on the contact surface of the body, wherein the amorphous fluoropolymer layer is permeable to gases having an atomic mass greater than 4, wherein the amorphous fluoropolymer layer has a helium permeability coefficient of greater than $2.5 \times 10^{-8}$ $cm^3*cm/cm^2*S*cmHg$.

2. The superstrate of claim 1, wherein the amorphous fluoropolymer comprises a dioxolane ring.

3. The superstrate of claim 1, wherein the amorphous fluoropolymer comprises a perflurorodioxole tetrafluoroethylene copolymer.

4. The superstrate of claim 1, wherein the amorphous fluoropolymer comprises perfluoro(3-butenyl vinyl ether).

5. The superstrate of claim 1, wherein the body comprises a hydrocarbon polymer layer between the contact surface and the amorphous fluoropolymer layer.

6. The superstrate of claim 5, wherein the hydrocarbon polymer layer comprises polytrimethylsilyl propyne, polymethyl methacrylate, polycarbonate polymers, polyimides, and any combination thereof.

7. The superstrate of claim 1, wherein the amorphous fluoropolymer layer has a critical surface tension of at least 20 mN/m and no more than 40 mN/m.

8. The superstrate of claim 1, wherein the amorphous fluoropolymer layer comprises:

—(CXY—CF2-)$a$-(-Z-)$b$-;

wherein X and Y comprise F, Cl, or H; and
    Z comprises a four (4), five (5), or six (6) member fluorocarbon ring structure containing at least one C—O—C linkage.

9. The superstrate of claim 1, wherein the amorphous fluoropolymer layer is permeable to nitrogen, oxygen, and argon.

10. The superstrate of claim 1, wherein the amorphous fluoropolymer layer comprises an oxygen permeation coefficient of greater than $1.0 \times 10^{-10}$ cm3*cm/cm2*S*cmHg.

11. A method of planarization, comprising:
    dispensing a planarization precursor material over a substrate, wherein the substrate includes a non-uniform surface topography;
    contacting the planarization precursor material with a superstrate, wherein the superstrate comprises:
    a body, wherein the body comprises a contact surface; and
    an amorphous fluoropolymer layer on the contact surface of the body, wherein the amorphous fluoropolymer layer is permeable to gases having an atomic mass greater than 4, wherein the amorphous fluoropolymer layer has a helium permeability coefficient of greater than $2.5 \times 10\text{-}8$ cm3*cm/cm2*S*cmHg; and
    curing the planarization precursor material to form a planarization layer over the substrate, wherein curing is performed while the superstrate is contacting the planarization precursor material.

12. The method of claim 11, further comprising flowing a gas before contacting the planarization precursor material with the body of the superstrate.

13. The method of claim 12, wherein the gas comprises oxygen, nitrogen, argon, or any combination thereof.

14. The method of claim 12, wherein the gas comprises an inert gas and wherein the inert gas does not comprise helium.

15. The method of claim 11, wherein the amorphous fluoropolymer comprises a dioxolane ring.

16. The method of claim 11, wherein the amorphous fluoropolymer comprises a perflurorodioxole tetrafluoroethylene copolymer.

17. The method of claim 10, wherein the amorphous fluoropolymer is a polymer or copolymer of perfluoro(3-butenyl vinyl ether).

18. The method of claim 11, wherein the amorphous fluoropolymer layer is permeable to nitrogen, oxygen, and argon.

19. The method of claim 11, wherein the amorphous fluoropolymer layer comprises an oxygen permeation coefficient of greater than $1.0 \times 10^{-10}$ cm3*cm/cm2*S*cmHg.

20. A method of manufacturing an article, comprising:
depositing a formable material on a substrate;
contacting the formable material on the substrate with a superstrate to form a planar layer, wherein the superstrate comprises:
    a body, wherein the body comprises a contact surface; and
    an amorphous fluoropolymer layer on the contact surface of the body, wherein the amorphous fluoropolymer layer is permeable to gases having an atomic mass greater than 4, wherein the amorphous fluoropolymer layer has a helium permeability coefficient of greater than $2.5 \times 10^{-8}$ cm3*cm/cm2*S*cmHg;
separating the superstrate and the planar layer on the substrate;
processing the substrate on which the planar layer has been formed; and
manufacturing the article from the processed substrate.

* * * * *

UNITED STATES PATENT AND TRADEMARK OFFICE
CERTIFICATE OF CORRECTION

PATENT NO. : 10,892,167 B2
APPLICATION NO. : 16/293053
DATED : January 12, 2021
INVENTOR(S) : James P. De Young et al.

It is certified that error appears in the above-identified patent and that said Letters Patent is hereby corrected as shown below:

On the Title Page

In Column 2, Item (56), Other Publications, Line 4, please delete "voluem", and insert --volume--

In Column 1, Item (56), Other Publications, page 2, Line 2, please delete "2,2-pistrifluoromethyl-4,5-difluoro-1", and insert --2,2-bistrifluoromethyl-4,5-difluoro-1--

In the Claims

Column 8, Line 48, please delete "$1.0 \times 10^{-10}$cm3*cm/cm2*S*cmHg.", and insert --$1.0 \times 10^{-10}$ $cm^3*cm/cm^2*S*cmHg$.--

Column 8, Line 61, please delete "$2.5 \times 10\text{-}8$ cm3*cm/cm2*S*cmHg;", and insert --$2.5 \times 10^{-8} cm^3*cm/cm^2*S*cmHg$;--

Column 9, Line 19, please delete "$1.0 \times 10^{-10}$ cm3*cm/cm2*S*cmHg.", and insert --$1.0 \times 10^{-10}$ $cm^3*cm/cm^2*S*cmHg$.--

Column 10, Line 13-14, please delete "$2.5 \times 10\text{-}8$ cm3*cm/cm2*S*cmHg;", and insert --$2.5 \times 10^{-8}$ $cm^3*cm/cm^2*S*cmHg$;--

Signed and Sealed this
Twenty-seventh Day of December, 2022

Katherine Kelly Vidal
*Director of the United States Patent and Trademark Office*